(12) United States Patent
Lin et al.

(10) Patent No.: US 8,921,828 B2
(45) Date of Patent: Dec. 30, 2014

(54) LIGHT EMITTING DIODE WITH MULTIPLE QUANTUM WELL STRUCTURE

(71) Applicant: Advanced Optoelectronic Technology, Inc., Hsinchu Hsien (TW)

(72) Inventors: Ya-Wen Lin, Hsinchu (TW); Shih-Cheng Huang, Hsinchu (TW); Po-Min Tu, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/855,636

(22) Filed: Apr. 2, 2013

(65) Prior Publication Data

US 2013/0313515 A1    Nov. 28, 2013

(30) Foreign Application Priority Data

May 25, 2012    (CN) .......................... 2012 1 0166030

(51) Int. Cl.
    *H01L 29/06*    (2006.01)
    *H01L 31/00*    (2006.01)
    *H01L 33/04*    (2010.01)
    *H01L 33/06*    (2010.01)
    *H01L 33/32*    (2010.01)

(52) U.S. Cl.
    CPC ................. *H01L 33/04* (2013.01); *H01L 33/06* (2013.01); *H01L 33/32* (2013.01)
    USPC .................................... 257/13; 257/E33.005

(58) Field of Classification Search
    None
    See application file for complete search history.

(56) References Cited

U.S. PATENT DOCUMENTS

| 4,882,734 A * | 11/1989 | Scifres et al. | 372/45.012 |
| 2004/0135136 A1 * | 7/2004 | Takahashi et al. | 257/14 |
| 2007/0152207 A1 * | 7/2007 | Yen et al. | 257/14 |
| 2011/0147700 A1 | 6/2011 | Son | |

* cited by examiner

*Primary Examiner* — Sonya D McCall Shepard
(74) *Attorney, Agent, or Firm* — Novak Druce Connolly Bove + Quigg LLP

(57) ABSTRACT

An exemplary light emitting diode includes a first type semiconductor layer, a second type semiconductor layer, and a multi quantum well layer sandwiched between the first and second type semiconductor layers. The multi quantum well layer includes a first barrier layer, a second barrier layer, two well layers sandwiched between the first and second barrier layers, and a third barrier layer sandwiched between the two well layers. The first and second barrier layers each have an energy level of conduction band higher than that of the third barrier layer. The first and second barrier layers each have an energy level of valence band higher than that of the third barrier layer.

8 Claims, 4 Drawing Sheets

LIGHT EMITTING DIODE WITH MULTIPLE QUANTUM WELL STRUCTURE

BACKGROUND

1. Technical Field

The present disclosure generally relates to light emitting devices, and particularly to a light emitting diode (LED) having an improved multiple quantum well structure thereby enhancing the light output efficiency of the LED.

2. Description of the Related Art

In recent years, due to excellent light quality and high luminous efficiency, light emitting diodes (LEDs) have increasingly been used as substitutes for incandescent bulbs, compact fluorescent lamps and fluorescent tubes as light sources of illumination devices.

A light emitting diode usually includes an n-type semiconductor layer, a p-type semiconductor layer and an active layer sandwiched between the n-type and p-type semiconductor layers. However, a low density of electrons and holes distribution undesirably leads to unsatisfied light emitting efficiency.

Therefore, it is desirable to provide a light emitting diode to overcome the above mentioned shortcomings.

BRIEF DESCRIPTION OF THE DRAWINGS

The components of the drawings are not necessarily drawn to scale, the emphasis instead being placed upon clearly illustrating the principles of the embodiments of the display device. Moreover, in the drawings, like reference numerals designate corresponding parts throughout several views.

DETAILED DESCRIPTION

Figure 1:
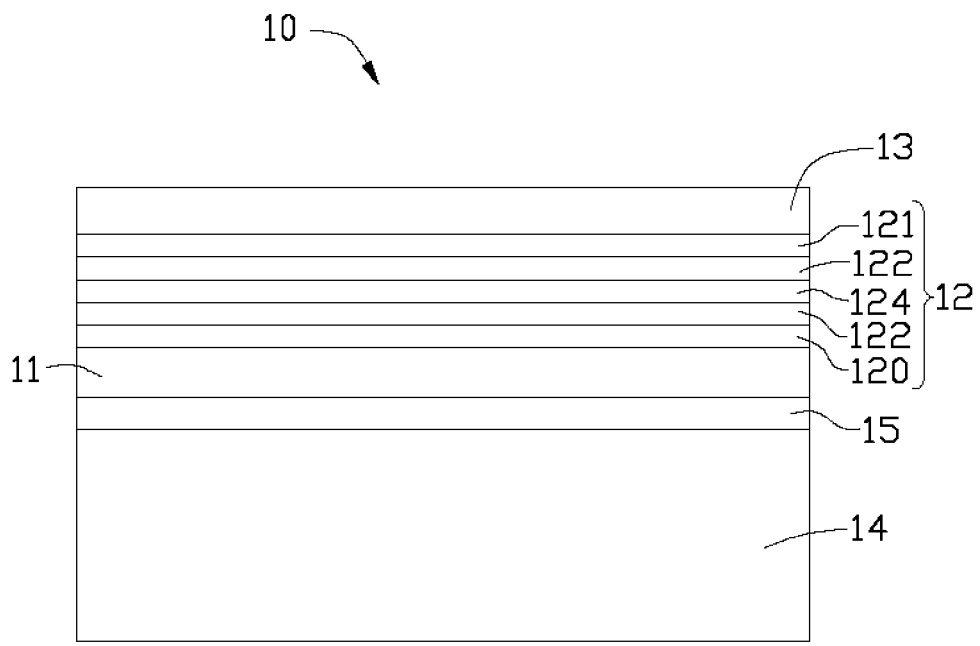
FIG. 1 is a cross-sectional view of a light emitting diode according to a first embodiment of the present disclosure.

Referring to FIG. 1, a light emitting diode 10 in accordance with a first embodiment of the disclosure is shown. The light emitting diode 10 includes a first type semiconductor layer 11, a multi quantum well layer 12 and a second type semiconductor layer 13.

The first type semiconductor layer 11 is an N-doped GaN (gallium nitride) layer. In this embodiment, the first type semiconductor layer 11 is formed on a sapphire substrate 14. Further, the sapphire substrate 14 has a nucleation layer 15 formed thereon beforehand, whereby the first type semiconductor layer 11 is formed on the nucleation layer 15.

The multi quantum well layer 12 is formed on the first type semiconductor layer 11. The multi quantum well layer 12 includes a first barrier layer 120, a second barrier layer 121, two well layers 122 sandwiched between the first barrier layer 120 and the second barrier layer 121, and a third barrier layer 124 sandwiched between the two well layers 122. Each well layer 122 is an $In_{x2}Ga_{1-x2}N$ layer, wherein $x2 \geq 0$. The first barrier layer 120 is an $In_{x3}Al_{y2}Ga_{1-x3-y2}N$ layer formed on the first type semiconductor layer 11, wherein $x3 \geq 0$, $y2 \geq 0$. The second barrier layer 121 is an $In_{x4}Al_{y3}Ga_{1-x4-y3}N$ layer, wherein $x4 \geq 0$, $y3 \geq 0$. The third barrier layer 124 is an $In_{x1}Al_{y1}Ga_{1-x1-y1}N$ layer, wherein $x1 \geq 0$, $y1 \geq 0$.

The energy levels of conduction bands of the first barrier layer 120 and the second barrier layer 121 are both higher than that of the third barrier layer 124. The energy levels of valence bands of the first barrier layer 120 and the second barrier layer 121 are both higher than that of the third barrier layer 124.

In this embodiment, the first barrier layer 120 has a conduction band with an energy level equal to that of the second barrier layer 121. In further detail, the first barrier layer 120 has a valence band with an energy level equal to that of the second barrier layer 121. Alternatively, the first barrier layer 120 can also be configured to have a conduction band with an energy level unequal to that of the second barrier layer 121, and the first barrier layer 120 can also be configured to have a valence band with an energy level unequal to that of the second barrier layer 121.

The second type semiconductor layer 13 is a P-doped GaN (gallium nitride) layer formed on the second barrier layer 121.

Figure 2:
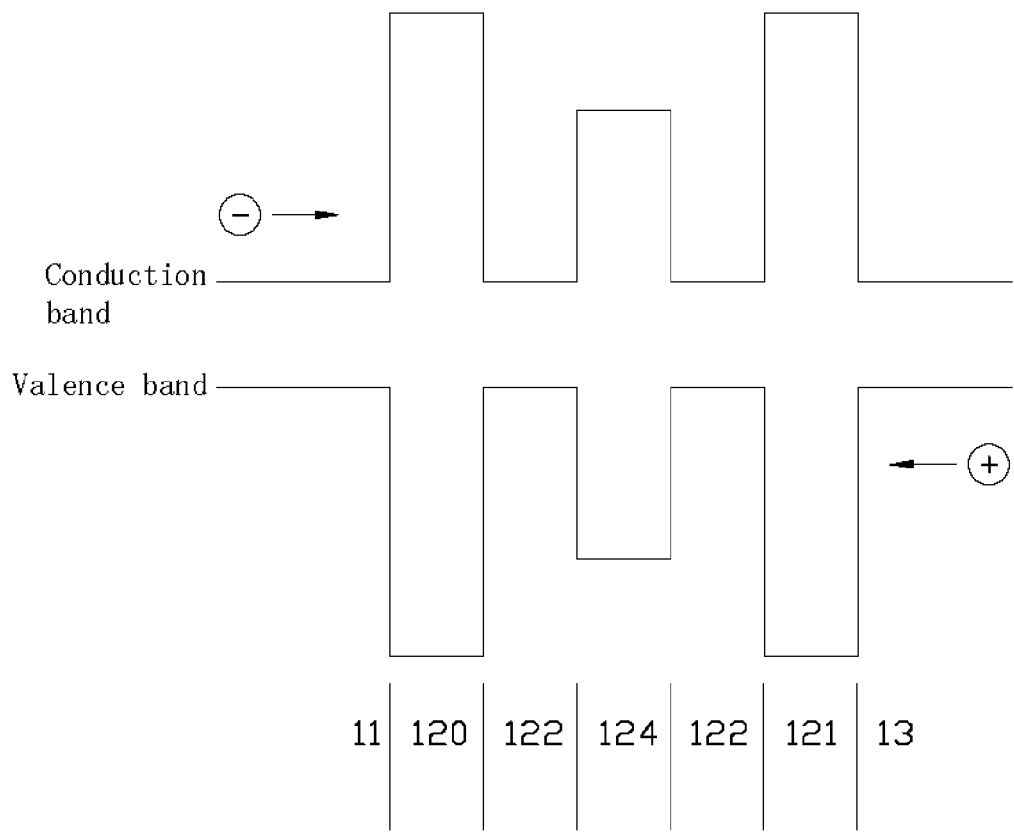
FIG. 2 is a band diagram of the light emitting diode of FIG. 1.

Referring to FIG. 2, due to that the energy levels of conduction bands of the first barrier layer 120 and the second barrier layer 121 are both higher than that of the third barrier layer 124, and that the energy levels of valence bands of the first barrier layer 120 and the second barrier layer 121 are both higher than that of the third barrier layer 124, electrons and electron holes can be effectively concentrated in the well layers 122, thereby increasing a density of electrons and electron holes distribution, which in turn increases the chance of recombination of the electrons and the electron holes and accordingly enhances the light emitting efficiency of the light emitting diode 10.

Figure 3:
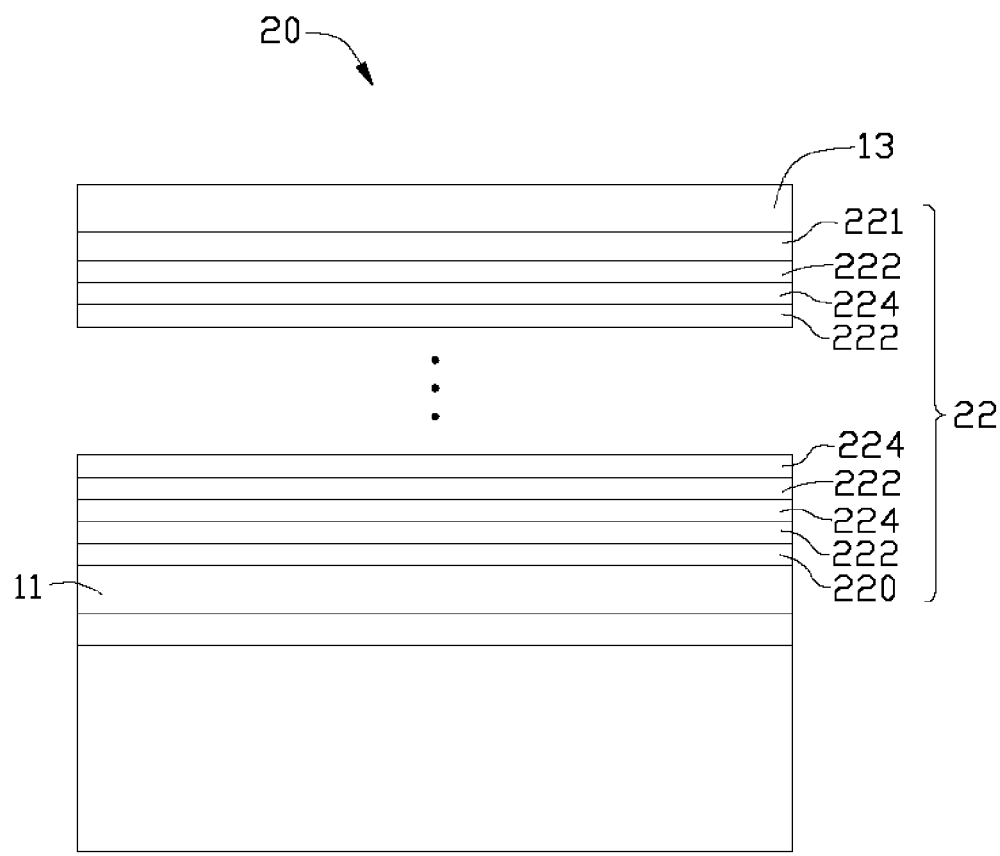
FIG. 3 is a cross-sectional view of a light emitting diode according to a second embodiment of the present disclosure.

Referring to FIG. 3, a light emitting diode 20 in accordance with a second embodiment of the disclosure is shown, which has a configuration similar to the light emitting diode 10 of the first embodiment. The light emitting diode 20 also includes a first type semiconductor layer 11, a second type semiconductor layer 13, and a multi quantum well layer 22 sandwiched between the first type semiconductor layer 11 and the second type semiconductor layer 13.

What is different from the light emitting diode 10 is that the multi quantum layer 22 includes a first barrier layer 220, a second barrier layer 221, a plurality of well layers 222 sandwiched between the first barrier layer 220 and the second barrier layer 221, and a plurality of third barrier layers 224 each sandwiched between two corresponding well layers 222. Each well layer 222 is an $In_{x2}Ga_{1-x2}N$ layer, wherein $x2 \geq 0$. The first barrier layer 220 is an $In_{x3}Al_{y2}Ga_{1-x3-y2}N$ layer formed on the first type semiconductor layer 11, wherein $x3 \geq 0$, $y2 \geq 0$. The second barrier layer 221 is an $In_{x4}Al_{y3}Ga_{1-x4-y3}N$ layer, wherein $x4 \geq 0$, $y3 \geq 0$. The third barrier layer 224 is an $In_{x1}Al_{y1}Ga_{1-x1-y1}N$ layer, wherein $x1 \geq 0$, $y1 \geq 0$.

The second type semiconductor layer 13 is a P-doped GaN (gallium nitride) layer formed on the second barrier layer 221.

The energy levels of conduction bands of the first barrier layer 220 and the second barrier layer 221 are both higher than that of the third barrier layer 224. The energy levels of valence bands of the first barrier layer 220 and the second barrier layer 221 are both higher than that of the third barrier layer 224. In this embodiment, the first barrier layer 220 has a conduction band with an energy level lower than that of the second barrier layer 221. In further detail, the first barrier layer 220 has a valence band with an energy level lower than that of the second barrier layer 221.

Figure 4:
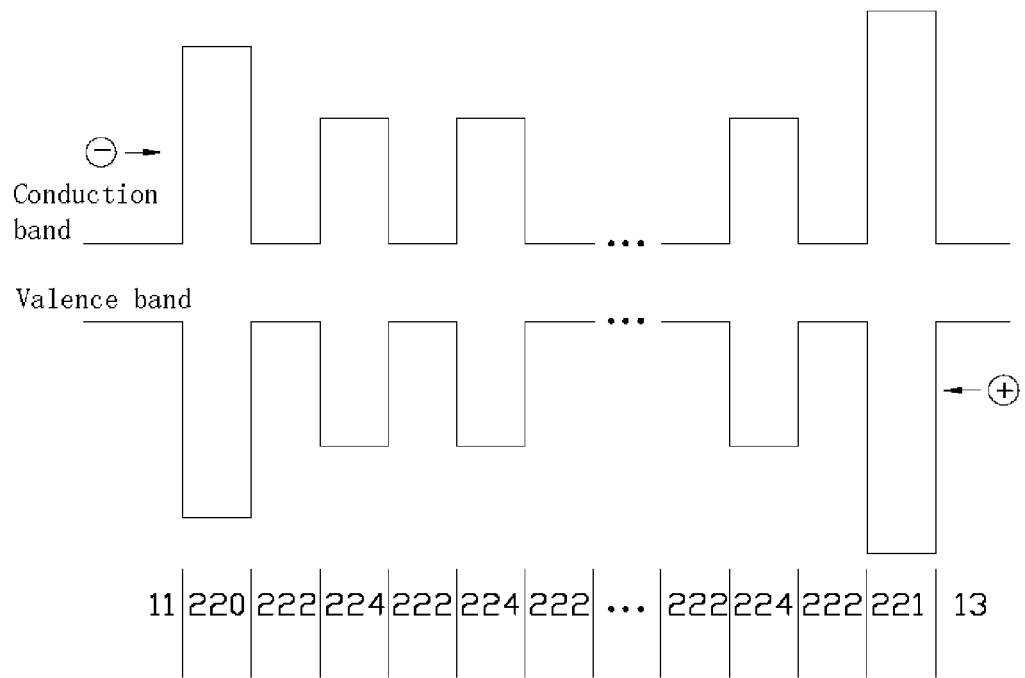
FIG. 4 is a band diagram of the light emitting diode of FIG. 3.

Referring to FIG. 4, due to that the energy levels of conduction bands of the first barrier layer 220 and the second barrier layer 221 are both higher than that of the third barrier layer 224, and that the energy levels of valence bands of the first barrier layer 220 and the second barrier layer 221 are both higher than that of the third barrier layer 224, electrons and electron holes can be effectively concentrated in the well layers 222, thereby increasing a density of electrons and electron holes distribution, which in turn increases the chance of recombination of the electrons and the electron holes and accordingly enhances the light emitting efficiency of the light emitting diode 20.

Alternatively, the first barrier layer 220 can also be configured to have a conduction band with an energy level higher than or equal to that of the second barrier layer 221, and the first barrier layer 220 can also be configured to have a valence band with an energy level higher than or equal to that of the second barrier layer 221.

It is to be further understood that even though numerous characteristics and advantages have been set forth in the foregoing description of the embodiment(s), together with details of the structures and functions of the embodiment(s), the disclosure is illustrative only; and that changes may be made in detail, especially in the matters of shape, size, and arrangement of parts within the principles of the disclosure to the full extent indicated by the broad general meaning of the terms in which the appended claims are expressed.

What is claimed is:

1. A light emitting diode, comprising:
a first type semiconductor layer;
a second type semiconductor layer; and
a multi quantum well layer sandwiched between the first and second type semiconductor layers,
wherein the multi quantum well layer comprises a first barrier layer, a second barrier layer, two well layers sandwiched between the first and second barrier layers, and a third barrier layer sandwiched between the two well layers, the first and second barrier layers each having an energy level of conduction band higher than that of the third barrier layer, the first and second barrier layers each having an energy level of valence band higher than that of the third barrier layer.

2. The light emitting diode of claim 1, wherein the energy level of the conduction band of the first barrier layer is equal to that of the second barrier layer.

3. The light emitting diode of claim 1, wherein the energy level of the valence band of the first barrier layer is equal to that of the second barrier layer.

4. The light emitting diode of claim 1, wherein the third barrier layer is an $In_{x1}Al_{y1}Ga_{1-x1-y1}N$ layer, $x1 \geq 0$, $y1 \geq 0$.

5. The light emitting diode of claim 1, wherein each of the well layers is an $In_{x2}Ga_{1-x2}N$ layers, $x2 \geq 0$.

6. The light emitting diode of claim 1, wherein the first barrier layer is an $In_{x3}Al_{y2}Ga_{1-x3-y2}N$ layer, $x3 \geq 0$, $y2 \geq 0$.

7. The light emitting diode of claim 1, wherein the second barrier layer is an $In_{x4}Al_{y3}Ga_{1-x4-y3}N$ layer, $x4 \geq 0$, $y3 \geq 0$.

8. A light emitting diode, comprising:
a substrate;
a nucleation layer formed on the substrate;
a first type semiconductor layer formed on the nucleation layer;
a second type semiconductor layer located over the first type semiconductor layer; and
a multi quantum well layer sandwiched between the first and second type semiconductor layers,
wherein the multi quantum well layer comprises a first barrier layer, a second barrier layer, at least two well layers sandwiched between the first and second barrier layers, and at least a third barrier layer sandwiched between the at least two well layers, the first and second barrier layers each having an energy level of conduction band higher than that of the at least a third barrier layer, the first and second barrier layers each having an energy level of valence band higher than that of the at least a third barrier layer.

* * * * *